United States Patent
Samuels et al.

(10) Patent No.: US 9,155,233 B2
(45) Date of Patent: Oct. 6, 2015

(54) ELECTROMAGNETIC SHIELD CONFIGURED TO INHIBIT DEFORMATION

(75) Inventors: Bruce Richard John Samuels, Lions Bay (CA); Edwin Sy Liu, Richmond (CA)

(73) Assignee: Sierra Wireless, Inc., Richmond, British Columbia (CA)

(*) Notice: Subject to any disclaimer, the term of this patent is extended or adjusted under 35 U.S.C. 154(b) by 7 days.

(21) Appl. No.: 13/600,690

(22) Filed: Aug. 31, 2012

(65) Prior Publication Data

US 2014/0063774 A1 Mar. 6, 2014

(51) Int. Cl.
*H05K 9/00* (2006.01)

(52) U.S. Cl.
CPC .................................. *H05K 9/0032* (2013.01)

(58) Field of Classification Search
CPC ........................................................ H05K 9/00
USPC ................ 361/728–747, 752–759, 796–802, 361/805–837; 174/350–397, 520–565
See application file for complete search history.

(56) References Cited

U.S. PATENT DOCUMENTS

| | | | |
|---|---|---|---|
| 3,816,911 A * | 6/1974 | Knappenberger | 29/841 |
| 6,178,097 B1 * | 1/2001 | Hauk, Jr. | 361/816 |
| 6,377,472 B1 * | 4/2002 | Fan | 361/800 |
| 6,420,009 B1 * | 7/2002 | Cheng | 428/99 |
| 6,552,261 B2 | 4/2003 | Shlahtichman et al. | |
| 6,676,137 B2 * | 1/2004 | Dean | 277/628 |
| 7,109,411 B2 | 9/2006 | Vinokor et al. | |
| 7,285,732 B2 | 10/2007 | Vinokor et al. | |
| 7,345,248 B2 | 3/2008 | Vinokor et al. | |
| 7,534,968 B2 | 5/2009 | English et al. | |
| 7,623,360 B2 * | 11/2009 | English et al. | 361/816 |
| 8,237,063 B2 * | 8/2012 | Chang | 174/382 |
| 2007/0139904 A1 | 6/2007 | English et al. | |
| 2007/0197092 A1 * | 8/2007 | Tanaka et al. | 439/607 |
| 2008/0080160 A1 | 4/2008 | English et al. | |
| 2008/0310139 A1 * | 12/2008 | English et al. | 361/818 |
| 2011/0094791 A1 | 4/2011 | Kim et al. | |
| 2012/0069534 A1 * | 3/2012 | Nagamura et al. | 361/752 |
| 2013/0161806 A1 * | 6/2013 | Zhang et al. | 257/676 |

FOREIGN PATENT DOCUMENTS

| | | |
|---|---|---|
| JP | 09172283 A | 6/1997 |
| KR | 1020040009840 A | 1/2004 |

OTHER PUBLICATIONS

CBS 10 & 20 Series, made by Leader Tech Inc., www.leadertechinc.com, 1 pp.
International Search Report for International Application No. PCT/CA2013/050653 dated Oct. 25, 2013, 3 pp.
Written Opinion for International Application No. PCT/CA2013/050653 dated Oct. 25, 2013, 4 pp.

* cited by examiner

*Primary Examiner* — Courtney Smith
*Assistant Examiner* — Rashen E Morrison
(74) *Attorney, Agent, or Firm* — Holland & Hart LLP

(57) ABSTRACT

An electromagnetic shield is provided, for example for a printed circuit board. A shield lid fits onto a base structure having at least two, more typically four, opposing sidewalls. The lid includes a top portion and a lip extending downward from the top portion to cap the base structure. The lid includes at least one deformation inhibiting feature extending downward from the top portion, for placement near or against an interior portion of a sidewall, for example against an edge of a folded-over sidewall. The deformation inhibiting feature may include one or more half-dimples stamped into the lid. In response to an external force, the deformation inhibiting feature presses against its adjacent sidewall in order to brace the shield lid. This inhibits the base structure from deforming the lip due to outward pressure of a sidewall onto a portion of the lip, located opposite the deformation inhibiting feature.

11 Claims, 5 Drawing Sheets

ELECTROMAGNETIC SHIELD CONFIGURED TO INHIBIT DEFORMATION

CROSS-REFERENCE TO RELATED APPLICATIONS

This is the first application filed for the present technology.

FIELD OF THE TECHNOLOGY

The present technology pertains in general to electromagnetic shields such as shield cans surrounding circuit components, and in particular to a feature for inhibiting deformation in an electromagnetic shield.

BACKGROUND

Electromagnetic shielding, such as radiofrequency (RF) shielding, is commonly provided over circuitry components, for example provided on a portion of a printed circuit board (PCB). The conductive enclosure provided by such shielding helps to electromagnetically isolate the circuitry inside the enclosure from the environment outside. Electromagnetic shielding is particularly useful for devices having RF communication capabilities, for example in order to electromagnetically isolate RF components such as antennas and transmission lines from other components such as digital components.

Various models of electromagnetic shields for mounting to PCBs include separate sidewall and lid components, which can be known in the art as multi-part shields. With the lid is disengaged, the area enclosed by the sidewalls can be accessed, in order to populate circuits to the PCB, test, adjust and repair the circuits, and the like. The lid may then be removably or non-removably engaged with the sidewalls. This option can be attractive as it offers improved ease of access to the shielded components.

However, as the lid is not integrally formed with the sidewalls, various problems may arise if the shield is mechanically deformed, for example as illustrated in FIG. 1. For example, due to an unintentional drop or intentional drop test, the shield sidewalls may become permanently deformed. This deformation may introduce gaps between the sidewalls and the lid or allow the lid to move with respect to the sidewalls. This may allow RF leakage through the shield and spurious RF emissions, which may be undesirable and potentially may result in safety or performance issues.

Examples of existing multipart shields are described for example in U.S. Pat. Nos. 6,552,261, 7,109,411, 7,623,360 and United States Patent Application Publication Nos. 2007/0139904, 2008/0080160 and 2011/0094791. However, these shielding solutions lack a desirable combination of structural integrity and simplicity. Furthermore, additional shielding solutions would advantageously provide for more choices during product design.

Therefore there is a need for an electromagnetic shield that is not subject to one or more limitations of the prior art.

This background information is provided for the purpose of making known information believed by the applicant to be of possible relevance to the present technology. No admission is necessarily intended, nor should be construed, that any of the preceding information constitutes prior art against the present technology.

SUMMARY OF THE TECHNOLOGY

An object of the present technology is to provide an electromagnetic shield configured to inhibit deformation. In accordance with an aspect of the present technology, there is provided an electromagnetic shield lid for fitting onto a base structure, the base structure comprising at least a first shield sidewall and a second shield sidewall opposite the first shield sidewall, the shield lid comprising: a top portion dimensioned to occupy an area between a top of the first shield sidewall and a top of the second shield sidewall; a first lip portion extending downward from the top portion for placement adjacent to an exterior face of the first shield sidewall; and a deformation inhibiting feature extending downward from the top portion for placement proximate to an interior portion of the second shield sidewall, wherein, in response to an external force which tends to cause the first shield sidewall to exert pressure on the first lip portion, the deformation inhibiting feature is configured to contact the interior portion of the second shield sidewall, thereby supporting the shield lid against the second shield sidewall to relieve said exerted pressure.

In accordance with another aspect of the present technology, there is provided a kit comprising: a shield lid blank shaped for forming into the shield lid as described above; and a set of instructions for forming the shield lid blank into said shield lid.

In accordance with another aspect of the present technology, there is provided a multipart electromagnetic shield comprising the shield lid and the base structure as described above.

BRIEF DESCRIPTION OF THE FIGURES

These and other features of the technology will become more apparent in the following detailed description in which reference is made to the appended drawings.

DETAILED DESCRIPTION OF THE TECHNOLOGY

Definitions

Figure 1:
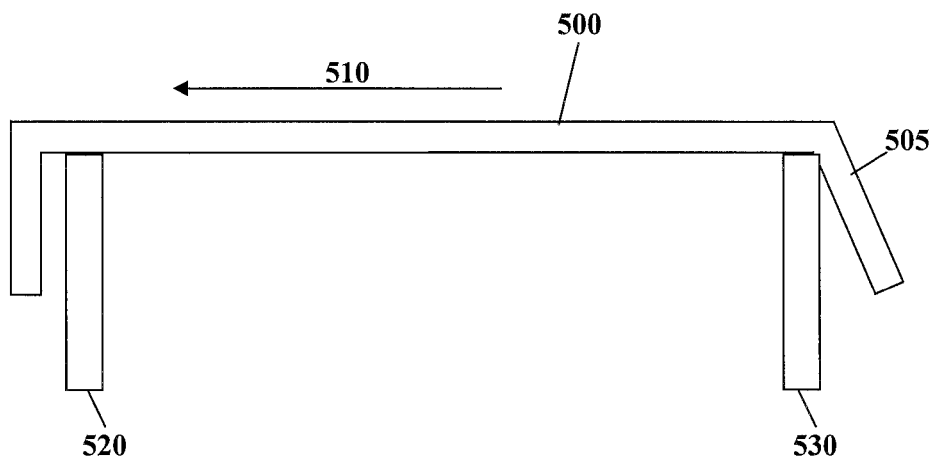
FIG. 1 illustrates a cross-sectional view of a shield lid undergoing deformation of the lip, in accordance with the prior art.

As used herein, the term "about" refers to a +/−10% variation from the nominal value. It is to be understood that such a variation is always included in a given value provided herein, whether or not it is specifically referred to.

Unless defined otherwise, all technical and scientific terms used herein have the same meaning as commonly understood by one of ordinary skill in the art to which this technology belongs.

Aspects of the present technology provide a multipart electromagnetic shield, in particular an electromagnetic shield for mounting on to a printed circuit board. The shield comprises a set of sidewalls for operative coupling to the circuit board and surrounding a region of the circuit board. The shield further comprises a separate lid which is configured for placement overtop of the sidewalls, thereby providing a substantially contiguous shield enclosure around and overtop of a cavity which contains the region of the circuit board. The lid is configured to engage the outer surface of the shield sidewalls in order to retain the lid in place. To this end the lid may include a lip which engages with outer surfaces of the shield sidewalls. The lip may correspond to a set of substantially 90 degree folds formed on at least one side of the shield lid and typically formed along all four sides of a substantially square or rectangular shield lid. The lid further comprises one or more deformation inhibiting features, for example protrusions, dimples, half dimple features or the like. The deformation inhibiting features extend from a top portion of the lid into the cavity and are proximate to or engaged with the shield sidewalls. The deformation inhibiting features are sufficiently resilient that, when one or more shield lid lips and/or shield sidewalls are subjected to a deforming force, the deformation inhibiting features make contact with the shield sidewalls and provide a counteracting force to the deforming force. Thus, deformation of the shield components is inhibited and the shield is made more structurally sound.

According to an aspect of the present technology, there is provided an electromagnetic shield lid for fitting onto a base structure. The base structure comprises at least a first shield sidewall and a second shield sidewall opposite the first shield sidewall. The base structure may comprise, for example, four contiguous shield sidewalls mounted onto a printed circuit board. In some embodiments, the shield sidewalls may comprise inwardly folded-over portions at the tops thereof. The shield lid comprises a top portion dimensioned to occupy an area between a top of the first shield sidewall and a top of the second shield sidewall. The top portion may have substantially the same size and shape as the area of the circuit board enclosed by the shield sidewalls. The shield lid further comprises a first lip portion extending downward from the top portion for placement adjacent to an exterior face of the first shield sidewall. The first lip portion may form one part of a shield lip which is formed around part or all of the shield lid top portion, for example on all four sides of a square shield lid. The top portion and the lip thus form a cap for fitting overtop of the base structure sidewalls. The cap may be held in place by friction, dimples, adhesive or the like. The shield lid further comprises a deformation inhibiting feature extending downward from the top portion for placement proximate to an interior portion of the second shield sidewall. The interior portion may comprise an edge of an inwardly folded-over portion of the second shield sidewall. Alternatively, the interior portion may comprise an interior face of the second shield sidewall, for example when no folded-over portion is present. The deformation inhibiting feature may be in the form of one or a pair of protrusions, dimples, half-dimples or the like, for example. In response to an external force which tends to cause the first shield sidewall to exert pressure on the first lip portion, the deformation inhibiting feature is configured to contact the interior portion of the second shield sidewall, thereby supporting the shield lid against the second shield sidewall to relieve said exerted pressure.

In various embodiments, limited amounts of elastic deformation to the shield lid and lip, and/or the shield sidewalls, may be tolerable, as the shield components are expected to return to its initial shape after such deformation. However, plastic deformation, that is deformation beyond the limits of the shield components' ability to elastically recover, is to be avoided by inclusion of the one or more deformation inhibiting features. In fact, elastic deformation may be required in some embodiments in order that the one or more deformation inhibiting features, which may be spaced apart from their adjacent shield sidewalls, contact those shield sidewalls to begin their reinforcing or bracing effect.

In various embodiments, the shield lid is formed substantially of a single sheet of material having bent sections along its perimeter in order to form the lip. If these bent sections are deformed, for example due to impacts from dropping the device, then the bending of the lip may be partially undone. This may in turn cause the shield lid to loosen, and may further cause a risk of electromagnetic radiation leakage into and/or out of the shielded region. The one or more deformation inhibiting features formed proximate to a first edge of the shield lid are configured to inhibit such deformation.

The lip and shield sidewalls may comprise various gripping means for grippingly engaging the lid to the sidewalls. Gripping means may include mating dimples or mating tabs and slots, formed on the lip and sidewalls, respectively. Notably, if the shield sidewalls and/or lips were to be deformed, the gripping means would be undesirably compromised. It is an object of the present technology to prevent this from happening.

Various embodiments of the present technology provide for a structurally simple shield which also has desirable structural integrity. The shield lid may be formed from a single piece of material by simply bending it into shape. For example, shield lid lips may be formed by bending the edges of the lid at about 90 degrees. Half-dimple features may be formed by cutting apertures into the shield lid and stamping the lid appropriately. Other deformation-inhibiting features may be similarly simply formed. Because the deformation-inhibiting features need not necessarily contact the inner portion of the shield sidewalls, manufacturing tolerances may be relaxed. Such simplicity allows for decreased cost and improved reliability of the current shielding solutions.

Some embodiments of the present technology provide a blank for assembly into the multipart electromagnetic shield as described above, optionally along with a set of assembly instructions in the form of a kit. The blank may comprise substantially planar metal elements which may be bent into the corresponding shield components. The blank may comprise pre-weakened regions corresponding to the appropriate bend sites. However, it is recognized that pre-weakened regions may be undesirable in some cases, as they may make the shield lid lips more prone to deformation.

As will be readily understood by a worker skilled in the art, the shield sidewalls and lid will typically be made of a conductive material such as ferromagnetic metal, nickel silver, copper, steel, or the like. The shield itself electromagnetically isolates the region inside the shield from the region outside the shield to at least a predetermined degree and in at least a predetermined frequency range, potentially including radio frequencies. In some embodiments, the shield may perform such electromagnetic isolation by attenuating electromagnetic signals at frequencies from a few hertz to over 50 GHz.

Embodiments of the present technology provide for an electromagnetic shielding product which is resistant to deformation, while at the same time being mechanically simple. This allows for lower manufacturing costs and less potential for operator error during assembly or disassembly.

In some embodiments, the one or more deformation inhibiting features may be provided as half dimple features. Half dimple features may be formed, for example, by cutting and stamping the shield lid with appropriate machinery or tools. Half of the dimple may be cut off after its formation, or a hole may be formed in the shield lid, followed by stamping. Various appropriate means for forming half dimple features will be readily understood by a worker skilled in the art. It is recognized herein that such half dimples can be formed with relative ease, which is beneficial to the present technology. It is noted that half-dimple features may be preferable as they can be formed relatively simply.

It is recognized that other types of deformation inhibiting features may be used in place of half dimples. For example, wedge-shaped features which protrude into the shield cavity may be welded or soldered to the shield lid. Semi-circular half dimples may be replaced by other shapes of half-dimples, such as triangular half dimples. If desired, apertures formed in the shield lid due to the presence of half dimples or other types of features may be covered with foil, a metal sheet, or other material. This may inhibit electromagnetic leakage through such apertures or the entry of dust, if such issues become problematic.

An alternative type of deformation inhibiting feature may be formed by forming a substantially C-shaped cut within the shield lid. The deformation inhibiting feature so defined by this cut may then be bent into the shield cavity along its linear edge which remains uncut. The bent portion then contacts or is proximate to an inner surface of a shield sidewall. The deformation inhibiting feature may be reinforced, for example by further bending triangular corner portions upward and away from the shield sidewall to contact or nearly contact the bottom surface of the shield lid. In some embodiments, to facilitate providing the reinforcement feature, the substantially C-shaped cut may be formed such that the feature widens out from the uncut, bent edge. For example, the cut may form three sides of a regular trapezoid, with the remaining uncut side being narrower than its opposite, parallel side. Corners of the trapezoid may be further bent or cut, if desired. Other shaped cuts may also be used. Alternatively, the deformation inhibiting feature may be reinforced by stamping with a dimple or other shaped feature.

Some embodiments include eight deformation inhibiting features such as half dimple features. The shield lid may be substantially rectangular or square, with two half dimple features located on each side of the rectangle or square, and proximate to the corners thereof. By placing the features in the corners, they are located proximate to corner portions of the shield sidewall structure. The corner portions of the shield sidewall structure are more predictable in location and more structurally rigid, thereby providing improved mechanical reinforcement in some embodiments. Alternatively, the features may be placed further away from the corners, where the shield sidewalls are expected to be more flexible. The greater flexibility of a sidewall toward its center may allow for a greater clearance between features and sidewall, since the sidewall is expected to deform more toward its center, thus contacting the features. Additionally, the greater flexibility of a sidewall toward its center may allow for the sidewall to be more easily bent out of shape if the deformation inhibiting feature is too close. Placement of the deformation inhibiting features may be optimized in view of the above.

In some embodiments, the shield may be configured such that the deformation inhibiting features make contact with the inner surface of the shield sidewalls upon assembly. The deformation inhibiting features may in this case operate as sidewall reinforcing features. However, in this case, tight manufacturing tolerances for the shield may be necessary, to ensure that the sidewalls fit between a lip of the shield lid and the deformation inhibiting features thereof.

In some embodiments, the shield may be configured such that the deformation inhibiting features are proximate to, but spaced apart from, the inner portion of the shield sidewalls upon assembly. A predetermined gap may therefore exist between the deformation inhibiting features and the shield sidewalls. This gap may be small enough that the deformation inhibiting features promptly make contact with the shield sidewalls when they initially deform due to dropping or other force, and inhibit further, potentially permanent deformation thereof. The gap may, however be large enough to accommodate irregularities during assembly, such as variability in the shield sidewalls, variability in the lid, pre-existing bends, irregular edges of the folded-over sidewall portions, or other irregularities in the shield sidewalls and/or lid, and the like.

Figure 2:
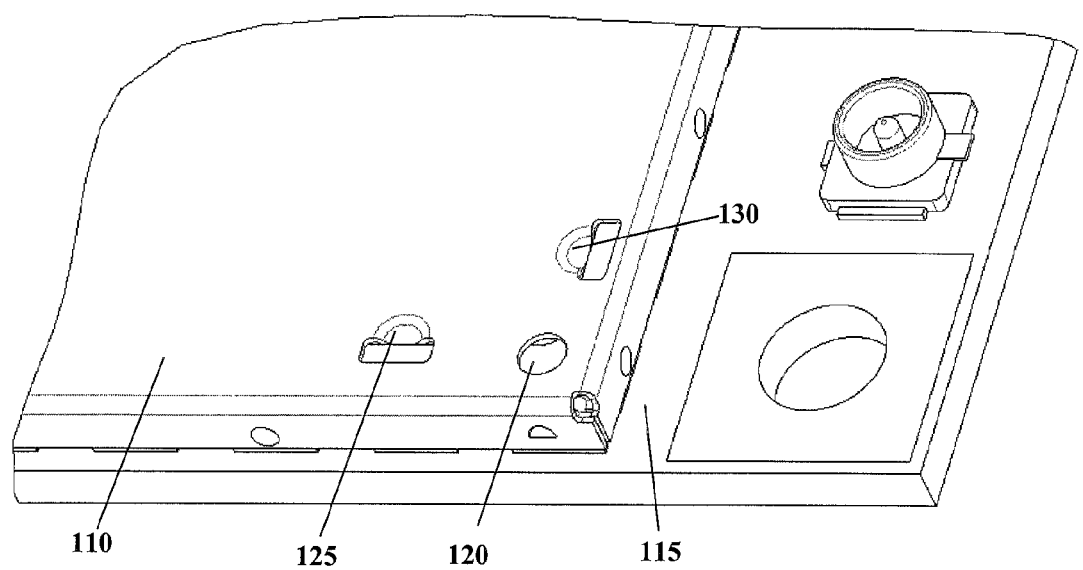
FIG. 2 illustrates a perspective view of a portion of a shield lid, in accordance with embodiments of the present technology.

FIG. 2 illustrates a perspective view of a corner of a shield lid 110 fitted over shield sidewalls. The shield sidewalls are mounted on a circuit board 115. A top portion 120 of the shield sidewalls is visible through apertures in the shield lid 110. The shield sidewall may comprise a vertical portion extending upward from the circuit board and a folded-over portion extending inward from the vertical portion at substantially 90 degrees. Thus, the illustrated top portion 120 of the shield sidewall may correspond to the folded over portion. Such folding provides improved strength and stability to the shield sidewall, for example by acting as a flange, and also provides an edge for contacting with the deformation inhibiting feature. As will be readily understood, a thin body, such as a shield sidewall folded-over portion, is more resilient to forces applied edge-on than to forces applied to a side face. The shield lid includes half-dimples 125, 130, situated near a corner of the shield lid. Providing the half-dimples comprises forming an inward depression in shield lid inward and forming an aperture which intersects with the inward depression. The line of intersection between depression and aperture forms an edge for contacting with the shield sidewall. Each of the other corners of the shield lid (not shown) includes two similar half-dimples.

Figure 3:
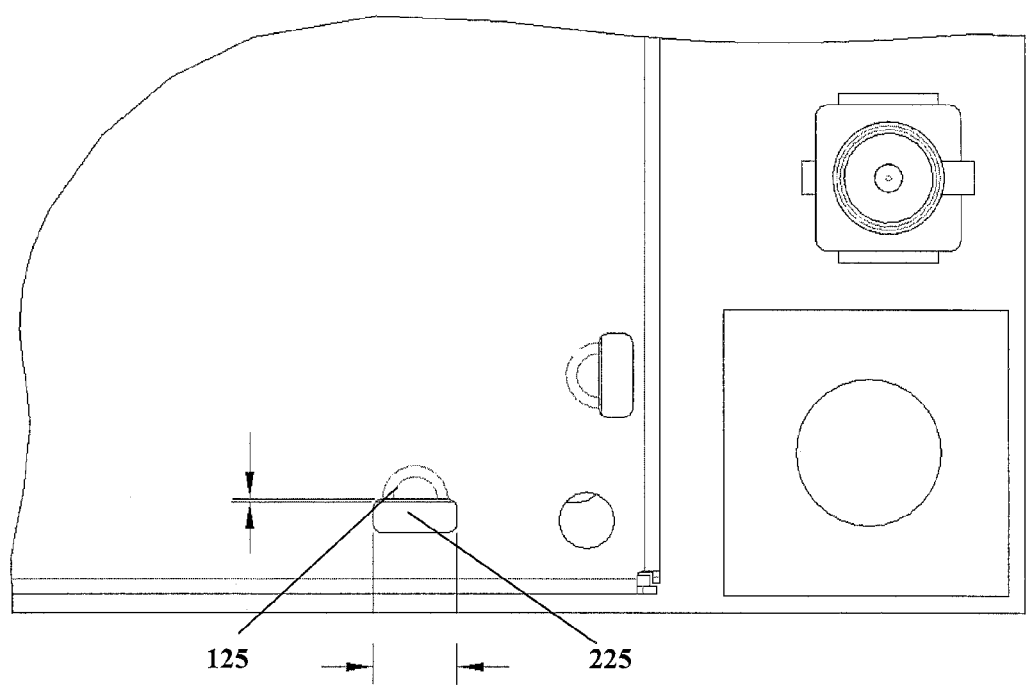
FIG. 3 illustrates a top view of the shield lid portion of FIG. 2, in accordance with embodiments of the present technology.

FIG. 3 illustrates a top view of FIG. 2 with dimensions provided in accordance with one embodiment of the technology. In particular, the aperture 225 adjacent half-dimple 125 can have a width of about 1.5 mm, and the half-dimple is spaced apart from the sidewall by for example 0.05 mm. As would be readily understood by a worker skilled in the art, these dimensions are merely an example and other dimensions can be selected on a case by case basis based for example on desired allowable deformation prior to contact of the deformation inhibiting feature with a sidewall.

Figure 4:
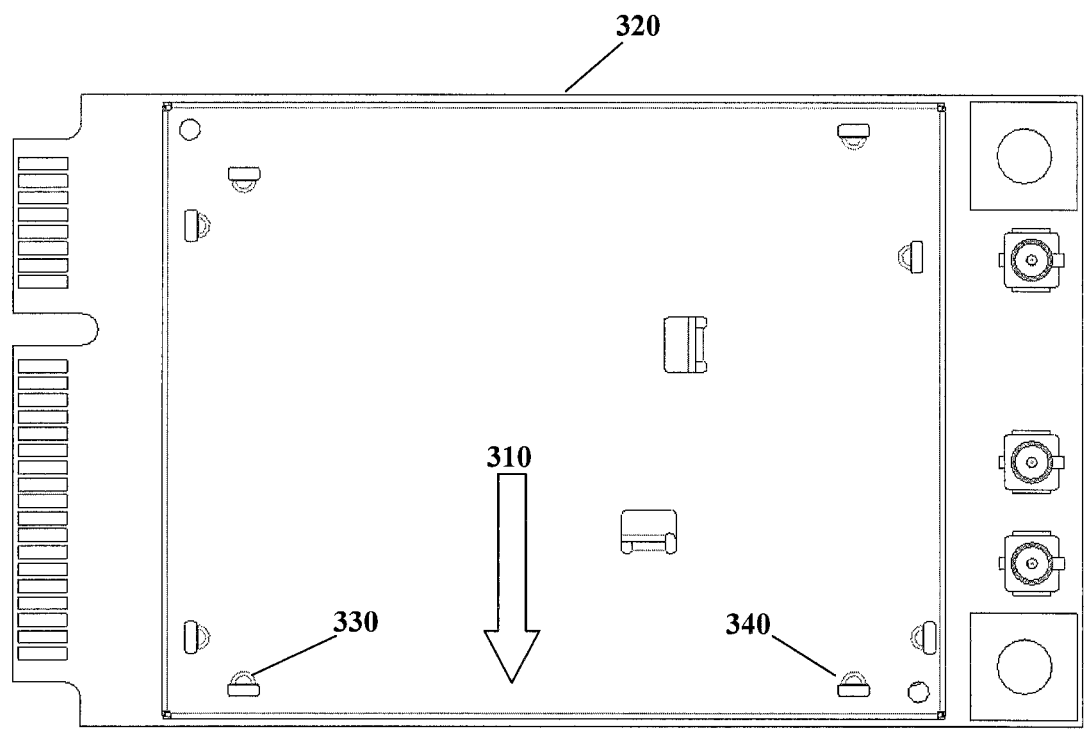
FIG. 4 illustrates top view of a shield lid, in accordance with embodiments of the present technology.

FIG. 4 illustrates a shield having eight half dimple features, with two half dimples located proximate to each corner of the shield lid. In some embodiments, these half dimple features may be approximately sized as described with respect to FIG. 3.

FIG. 4 further illustrates operation of the half dimples 330 and 340 as deformation inhibiting features in accordance with embodiments of the present technology. When, for example due to a drop, the lid is subjected to a force which tends to move it in direction 310, the two half dimples 330 and 340 resist movement of the lid. This inhibits motion of the shield lid relative to the opposite shield sidewall 320, which would otherwise tend to cause the lip of the shield lid adjacent to the sidewall 320 to yield, the sidewall 320 itself to yield, or a combination thereof. Such yielding would be due to the sidewall 320 exerting outward force on the adjacent lip, and may tend to undo bending of a lip which had previously been formed by bending. Such yielding might otherwise result in permanent deformation and damage to the shield.

The two half dimples 330 and 340 are configured to catch on the shield sidewall which is opposite to sidewall 320. Due to rigidity of the shield lid, the two half dimples 330 and 340 absorb some of the impact that would tend to be translated to and/or deform the sidewall 320. This reduces the amount of force which is applied toward deforming the lip adjacent to sidewall 320. Due to their shape and profile, the half dimples 330 and 340 are more resistant to deformation than the lip, and thus absorb the impact without deformation.

As illustrated, deformation inhibiting features may be present for all four sides of the shield lip. That is, half-dimples are configure to inhibit deformation of the shield lid lip when subjected to a force in the direction marked 310, a force opposite the direction marked 310, or a force perpendicular to the direction marked 310 and substantially in the plane of the shield lid.

Figure 5:
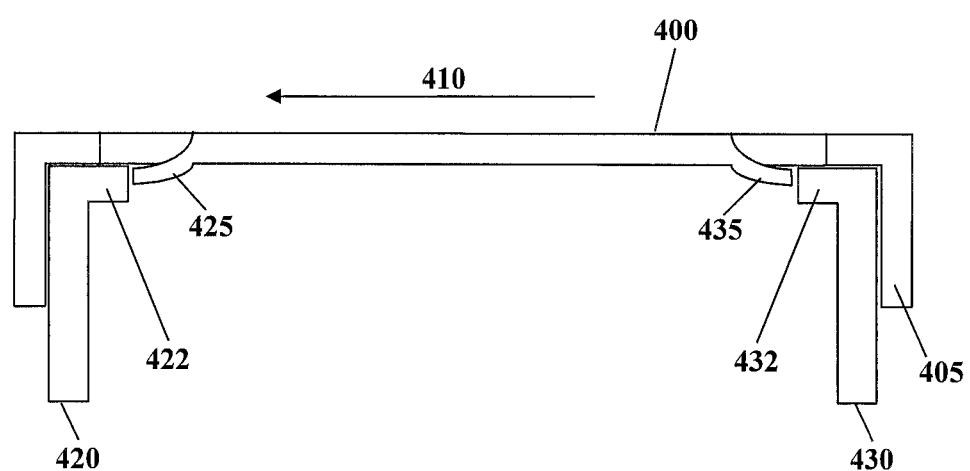
FIG. 5 illustrates a cross-sectional view of a shield lid, in accordance with embodiments of the present technology.

FIG. 5 illustrates a cross-sectional view of a shield lid 400, in accordance with embodiments of the technology. The shield lid forms a cap over the sidewalls 420 and 430. As illustrated, the sidewalls 420 and 430 include folded over portions 422 and 432, respectively. These portions operate as flanges to add strength to the sidewalls and to provide a firmer edge for the deformation inhibiting features to brace against. In some embodiments, the folded over portions 422 and 432 may be excluded, in which case the deformation inhibiting features would be placed adjacent to the unfolded sidewalls. Deformation inhibiting features 425 and 435, such as half-dimples, extend downward and adjacent to the folded over portions 422 and 432, respectively, of the sidewalls 420 and 430. When an external force 410 is applied in the illustrated direction, the sidewall 420 contacts the deformation inhibiting feature 425, thereby bracing the shield lid against the folded portion 422 of the sidewall 420. Clearances between the folded portions 422 and 432 of the sidewalls 420 and 430, the shield lid lip 405, and the deformation inhibiting features 425 and 435, have been exaggerated for clarity.

With further reference to FIG. 1, this figure illustrates a cross-sectional view of a shield lid 500 undergoing deformation of the lip, in accordance with the prior art. The shield lid forms a cap over the sidewalls 520 and 530. When an external force 510 is applied in the illustrated direction, the sidewall 530 pushes outward against the shield lid lip 505, thereby deforming it, potentially beyond its elastic limit. Clearances between the sidewalls 520 and 530 and the shield lid lip 505 have been exaggerated for clarity.

It is obvious that the foregoing embodiments of the technology are examples and can be varied in many ways. Such present or future variations are not to be regarded as a departure from the spirit and scope of the technology, and all such modifications as would be obvious to one skilled in the art are intended to be included within the scope of the following claims.

We claim:

1. An electromagnetic shield lid for fitting onto a base structure, the base structure comprising at least a first shield sidewall and a second shield sidewall opposite the first shield sidewall, the shield lid comprising:
   a. a top portion dimensioned to occupy an area between a top of the first shield sidewall and a top of the second shield sidewall; b. a first lip portion extending downward from the top portion for placement adjacent to an exterior face of the first shield sidewall; and c. a deformation inhibiting feature extending downward from the top portion for placement proximate to an interior portion of the second shield sidewall; wherein, before the interior portion of the second shield sidewall directly contacts the deformation inhibiting feature by way of an edge of an inwardly folded portion of the second shield sidewall, the deformation inhibiting feature is initially separated from the inwardly folded portion of the interior portion of the second shield sidewall by a gap and the edge of the inwardly folded portion devoid contact with the deformation inhibiting feature when the shield lid has been fitted onto the base structure,
   wherein, in response to an external force oriented perpendicular to the first shield sidewall which tends to cause the first shield sidewall to exert pressure on the first lip portion, initial deformation of one or both of the first shield sidewall and the first lip portion result in closure of the gap, the deformation inhibiting feature configured, upon contact with the edge of the folded over portion of the interior portion of the second shield sidewall due to said closure of the gap, to support the shield lid against the second shield sidewall to relieve said exerted pressure.

2. The shield lid of claim 1, further comprising a second lip portion extending downward from the top portion for placement adjacent to an exterior face of the second shield sidewall.

3. The shield lid of claim 2, further comprising a second deformation inhibiting feature extending downward from the top portion for placement proximate to an interior portion of the first shield sidewall, wherein, in response to a second external force which tends to cause the second shield sidewall to exert pressure on the second lip portion, the second deformation inhibiting feature is configured to contact the interior portion of the first shield sidewall, thereby supporting the shield lid against the first shield sidewall to relieve said exerted pressure due to the second external force.

4. The shield lid of claim 3, wherein the base structure further comprises a third shield sidewall and a fourth shield sidewall opposite the third shield sidewall, the first, second, third and fourth shield sidewalls forming a perimeter, the shield lid further comprising:
   a. a third lip portion extending downward from the top portion for placement adjacent to an exterior face of the third shield sidewall;
   b. a third deformation inhibiting feature extending downward from the top portion for placement proximate to an interior portion of the fourth shield sidewall;
   e. a fourth lip portion extending downward from the top portion for placement adjacent to an exterior face of the fourth shield sidewall; and
   d. a fourth deformation inhibiting feature extending downward from the top portion for placement proximate to an interior portion of the third shield sidewall.

5. The shield lid of claim 1, wherein the deformation inhibiting feature comprises a pair of half dimples, configured for placement proximate to opposite sides of the interior portion of the second shield sidewall.

6. The shield lid of claim 1, wherein at least the top portion, the first lip portion, and the deformation inhibiting feature are formed from a single piece of material.

7. The shield lid of claim 6, wherein at least the top portion, the first lip portion, and the deformation inhibiting feature are formed by cutting and bending a sheet of material.

8. A kit comprising: a shield lid blank shaped for forming into the shield lid of claim 1; and a set of instructions for forming the shield lid blank into said shield lid, the set of instructions comprising a first subset of instructions for bending a specified edge portion of the shield lid blank out of a plane of the shield lid blank to form the first lip portion extending downward from the top portion; and a second subset of instructions for forming the deformation inhibiting feature extending downward from the top portion in a specified location.

9. A multipart electromagnetic shield comprising the shield lid and the base structure according to claim 1.

10. The shield lid of claim 2, further comprising a second deformation inhibiting feature extending downward from the top portion for placement proximate to an interior portion of the first shield sidewall, the second deformation inhibiting feature initially separated from the interior portion of the first shield sidewall by another gap, wherein, in response to a second external force which tends to cause the second shield sidewall to exert pressure on the second lip portion, initial deformation of one or both of the second shield sidewall and the second lip portion result in closure of said other gap, the second deformation inhibiting feature configured, upon contact with the interior portion of the first shield sidewall due to said closure of said other gap, to support the shield lid against the first shield sidewall to relieve said exerted pressure due to the second external force.

11. The shield lid of claim 1, wherein the deformation inhibiting feature comprises a half dimple defining a face parallel to the interior portion of the second shield sidewall and the half dimple backed by a sloping section mated with the top portion.

\* \* \* \* \*